United States Patent [19]

Ito et al.

[11] Patent Number: 4,476,579

[45] Date of Patent: Oct. 9, 1984

[54] ELECTRONIC TUNING RADIO RECEIVER

[75] Inventors: Tatsuo Ito; Kazuyuki Hoda, both of Kobe; Masataka Mizuno, Akashi, all of Japan

[73] Assignee: Fujitsu Ten Limited, Kobe, Japan

[21] Appl. No.: 437,200

[22] Filed: Oct. 28, 1982

[30] Foreign Application Priority Data

Oct. 29, 1981 [JP] Japan .................................. 56-173583

[51] Int. Cl.³ ............................................. H04B 17/00
[52] U.S. Cl. .................................. 455/147; 324/77 CS; 455/226
[58] Field of Search ............................ 455/67, 145–147, 455/157, 158, 226; 324/77 B, 77 C, 77 CS, 77 D

[56] References Cited

U.S. PATENT DOCUMENTS

| | | | |
|---|---|---|---|
| 3,876,946 | 4/1975 | La Clair et al. | 324/77 CS |
| 4,074,200 | 2/1978 | Buchta | 455/147 |
| 4,118,666 | 10/1978 | Bernstein | 455/145 |
| 4,238,727 | 12/1980 | Madni | 324/77 CS |
| 4,244,024 | 1/1981 | Marzalek et al. | 324/77 B |

FOREIGN PATENT DOCUMENTS 46341  4/1981  Japan .................................. 455/226

Primary Examiner—Marc E. Bookbinder
Attorney, Agent, or Firm—Staas & Halsey

[57] ABSTRACT

An electronic tuning type radio receiver which is designed so that the received electric field intensity distribution in a received frequency band can be known at a glance. When predetermined key information is applied, receiving frequency designating information for determining the broadcasting station to be received is sequentially changed to detect the received electric field intensity of each received frequency. A received frequency vs electric field intensity distribution is produced based on the detected value and the corresponding received frequency and is displayed on a CRT display or the like.

7 Claims, 15 Drawing Figures

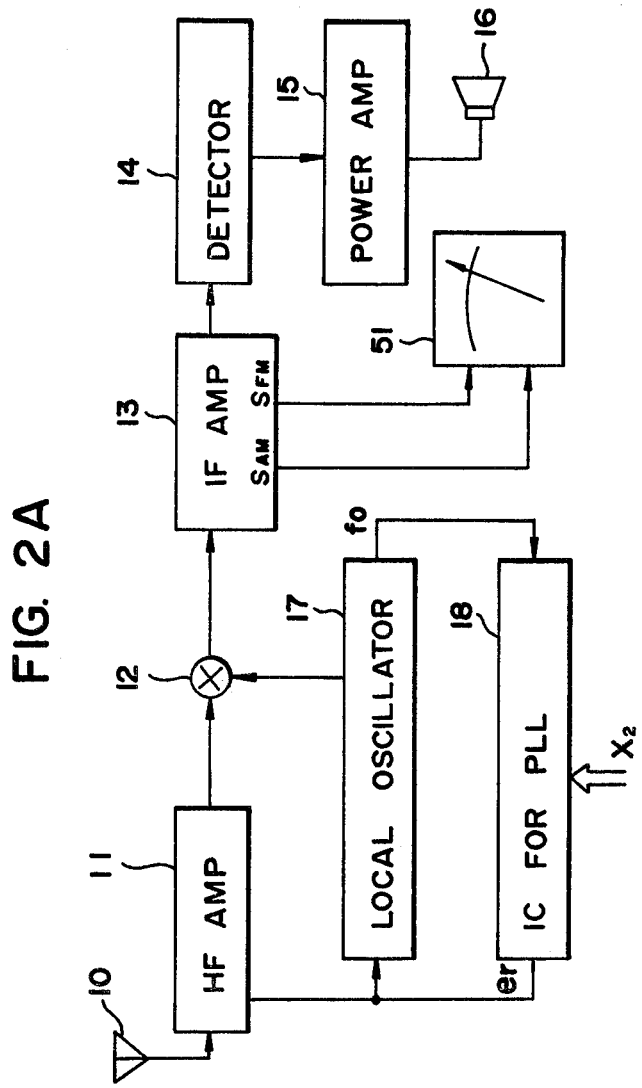

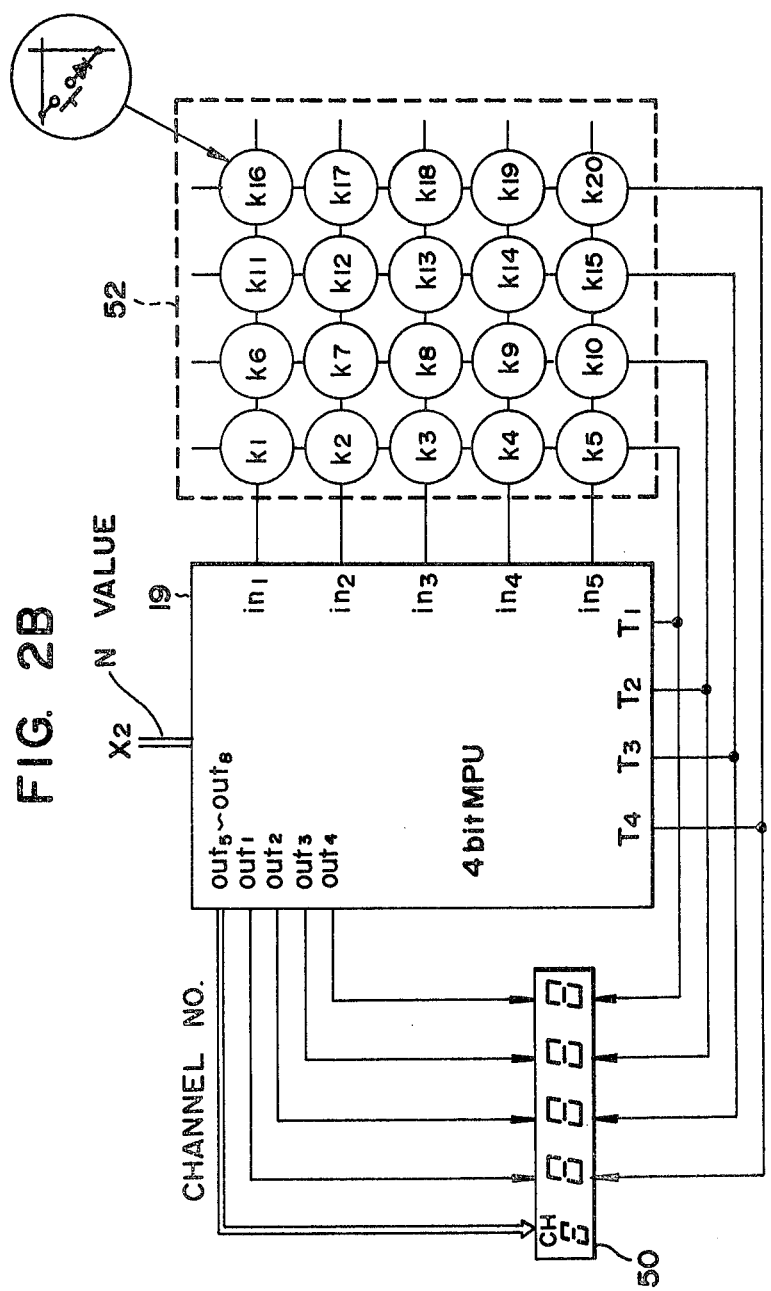

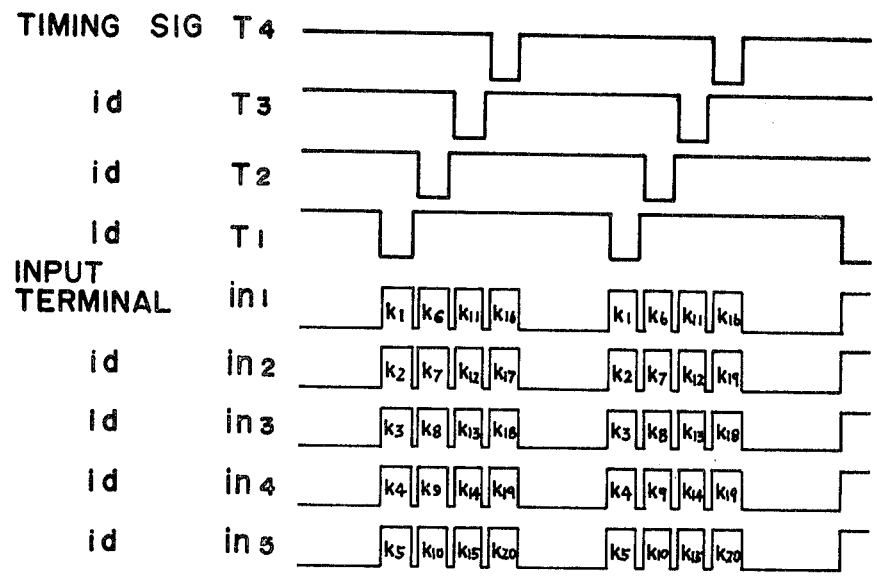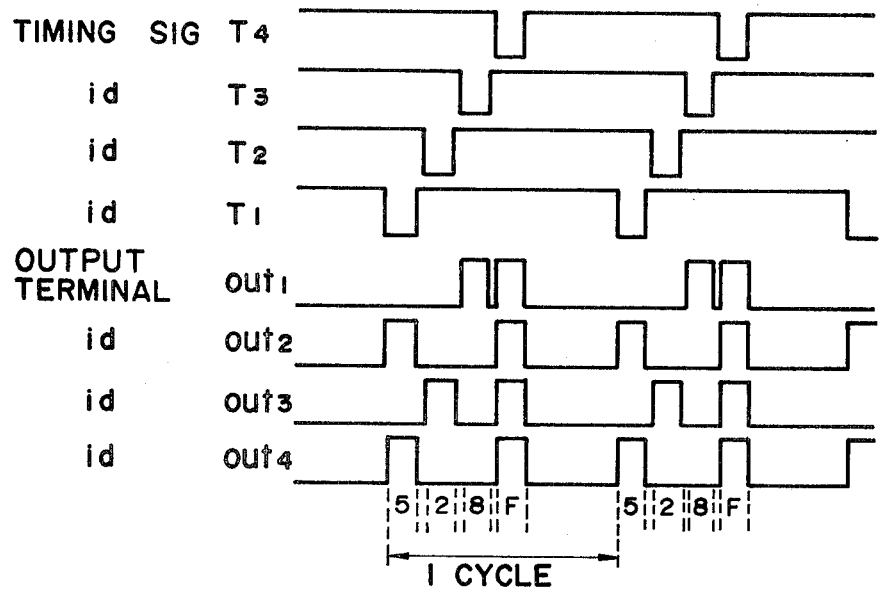

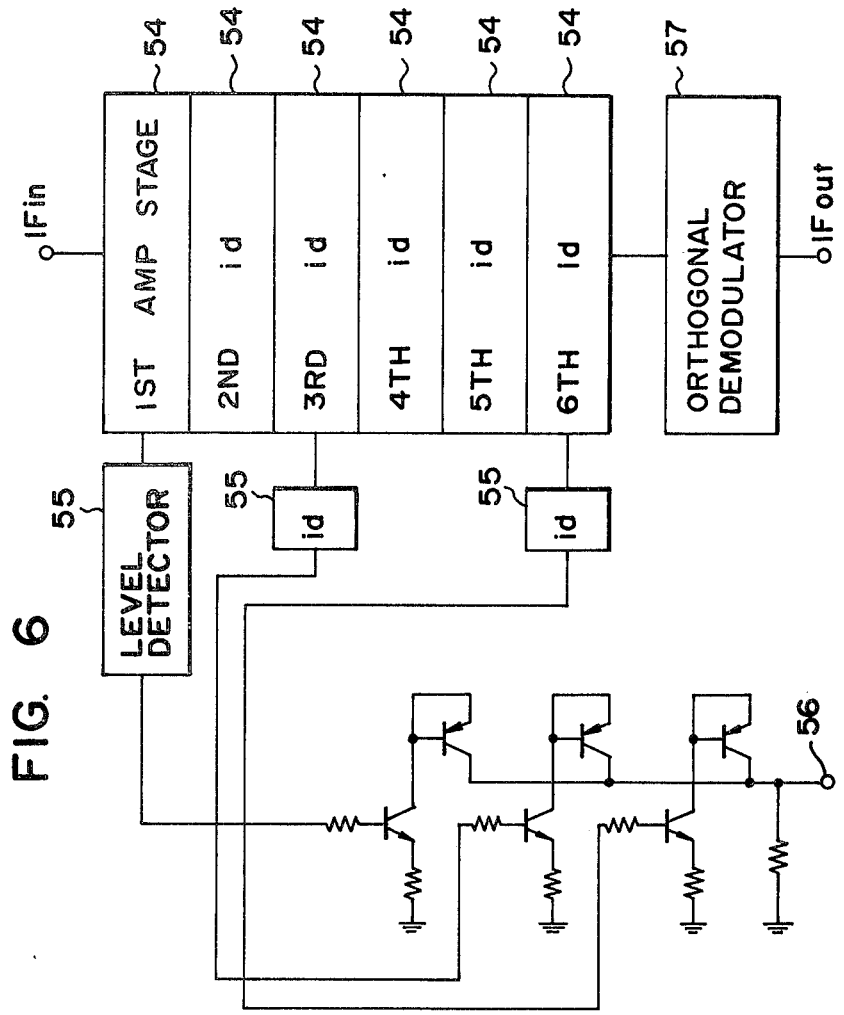

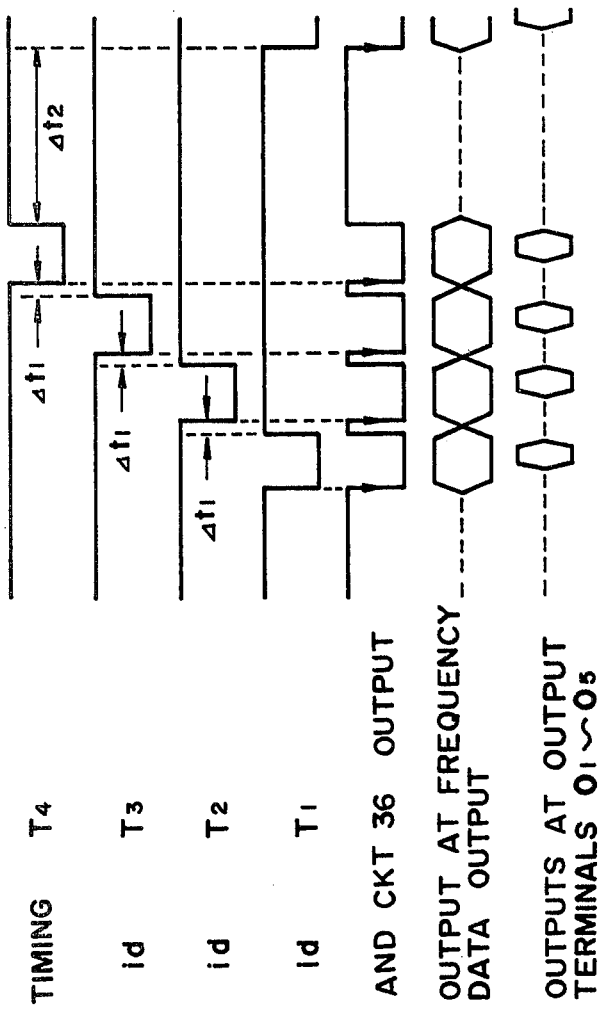

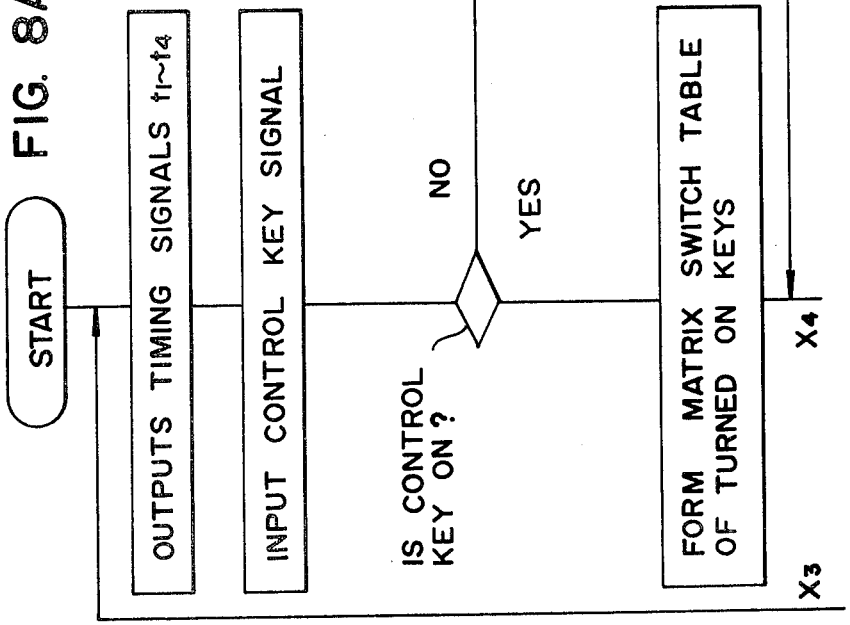

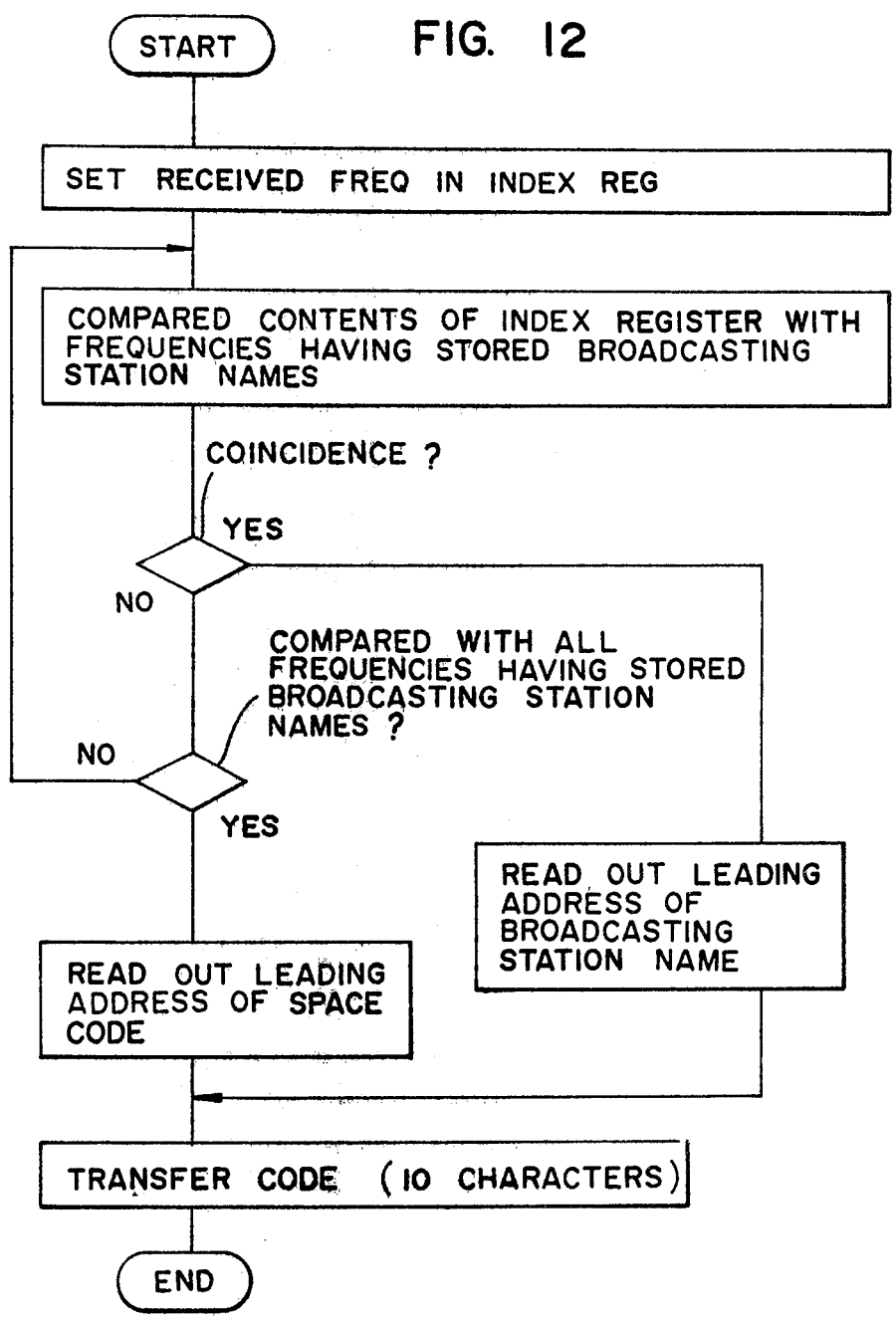

ELECTRONIC TUNING RADIO RECEIVER

BACKGROUND OF THE INVENTION

1. Field of the Invention

The present invention relates to a radio receiver and, more particularly, to an improvement in its received electric field intensity display means.

2. Description of the Prior Art

Heretofore the electric field intensity of broadcasting waves received by an antenna of a radio receiver has been displayed by a pointer on a signal meter or by lighting an array of LEDs or like display elements. With such a method, however, only the electric field intensity of the frequency being received is known and the electric field intensity distribution in the receiving frequency band is unknown. When taking an automobile drive, for instance, between mountains where radio reception is bad, the number of broadcasting stations of good reception is small and one often desires to receive the broadcasting station that can be received most clearly; with conventional radio receivers of the above-said type, however, the channel selection is very troublesome and this is undesirable for saftey driving.

SUMMARY OF THE INVENTION

It is therefore an object of the present invention to provide an electronic tuning type radio receiver which permits quick selective reception of with a broadcasting station of the best reception or strongest signal.

Another object of the present invention is to provide an electronic tuning type radio receiver which is adapted so that the received electric field intensity distribution in the receiving frequency band can be known at a glance.

Yet another object of the present invention is to provide an electronic tuning type radio receiver which is designed to display the received frequency vs. electric field intensity distribution and the name of a broadcasting station corresponding to the received frequency indicated by a cursor.

Briefly stated, the electronic tuning type radio receiver of the present invention is provided with an A/D converter for converting an analog electric field intensity signal from electric field intensity detecting means into a digital quantity. Upon application of predetermined key information from key input means, frequency designating information is sequentially changed to change the frequency to be recieved and frequency sweep means, which outputs the frequency being received at that time, is operated to sequentially change the frequency to be received, and the output from the A/D converter, which varies with the output from the frequency sweep means, is read out. Based on this value and the received frequency output from the frequency sweep means, the received frequency vs. electric field intensity distribution is produced by received frequency vs. electric field intensity distribution producing means. The received frequency vs. electric field intensity distribution thus obtained is stored in a storage and displayed on display means.

The frequency sweep means possesses the function of sequentially changing the receiving frequency designating information at a predetermined rate in response to an automatic sweep command. The received frequency vs. electric field intensity distribution producing means is responsive to the application of predetermined key information from the key input means to provide the automatic sweep command to the frequency sweep means, producing the received frequency vs. electric field intensity distribution from which the electric field intensity for each frequency can be known.

The radio receiver of the present invention is further provided with broadcasting station name storage means for prestoring the names of broadcasting stations corresponding to the frequencies to be received in the AM and FM frequency bands, cursor display means for displaying a cursor in an overlapping relationship with the received frequency vs. electric field intensity distribution displayed on the display means, the cursor being movable by a key operation of the key input means, and broadcasting station name display means for comparing the received frequency at the position of the cursor with each of the receiving frequencies prestored in the broadcasting station name storage means and, in the case of coincidence, displaying the received frequency and the name of the corresponding broadcasting station. In a case where the frequency sweep means is provided with means for storing given receiving frequency designating information corresponding to channel numbers and means responsive to the application thereto of a channel number to change the frequency being received to a frequency of the corresponding frequency designating information, there are provided identifying means for identifying the receiving frequency of the frequency sweep means preset corresponding to each channel number when predetermined key information is input from the key input means and storage means for prestoring the names of broadcasting stations corresponding to the frequencies to be received in the AM and FM frequency bands, by which the channel number corresponding to the name of the broadcasting station can also be displayed. It is also possible to arrange the received frequency vs. electric field intensity distribution producing means so that, when supplied with predetermined key information, it sequentially delivers out the channel numbers to the frequency sweep means, thereby detecting the electric field intensity distribution for each channel number. In this case, the received frequency vs. electric field intensity can be displayed from which only the electric field distribution for each channel number is known. Also in this case, it is possible to adopt an arrangement such that the received frequency, the channel number and the name of the broadcasting station corresponding to the received frequency are displayed at the position of the cursor.

BRIEF DESCRIPTION OF THE DRAWINGS

FIGS. 2(A) and 2(B) are block diagrams illustrating the principal part of an electronic tuning type radio receiver using a four-bit microcomputer;

FIGS. 3 and 4 are timing charts of the operation of the radio receiver shown in FIG. 2;

FIGS. 5 and 6 are block diagrams showing electric field intensity detecting means for use in the present invention;

FIG. 7 is a timing chart of the operation of the radio receiver shown in FIG. 1;

FIGS. 8(A) and 8(B) are flowcharts of an electrical matrix switching signal input operation which is performed by an eight-bit microprocessor 20;

FIG. 10 is a diagram showing the configuration of an ROM for loading received frequency data;

FIG. 12 is a flowchart of a broadcasting station search operation.

DESCRIPTION OF THE PREFERRED EMBODIMENTS

Figure 1A:
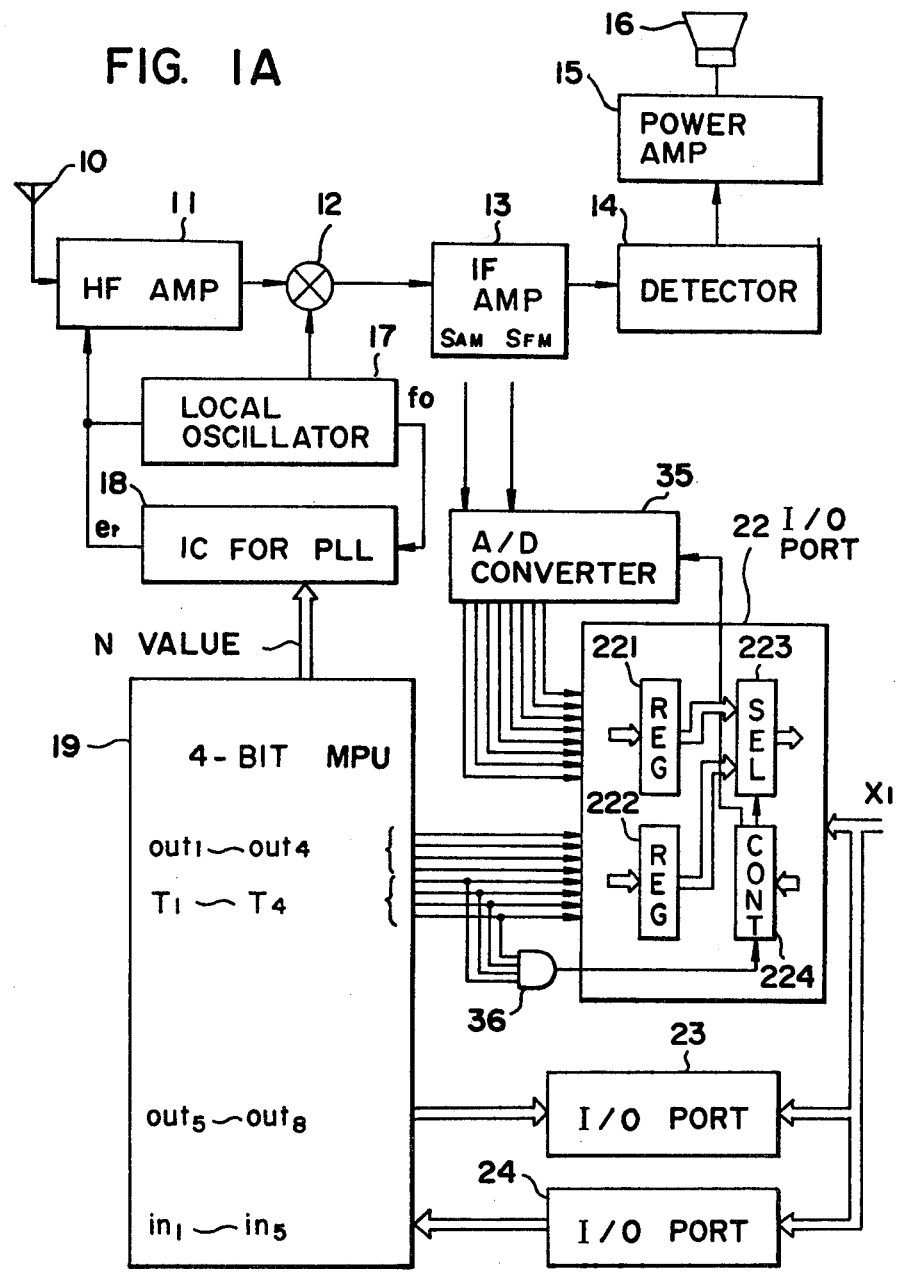
FIGS. 1(A) and 1(B) are block diagrams illustrating the principal part of an embodiment of the radio receiver according to the present invention.
Figure 1B:
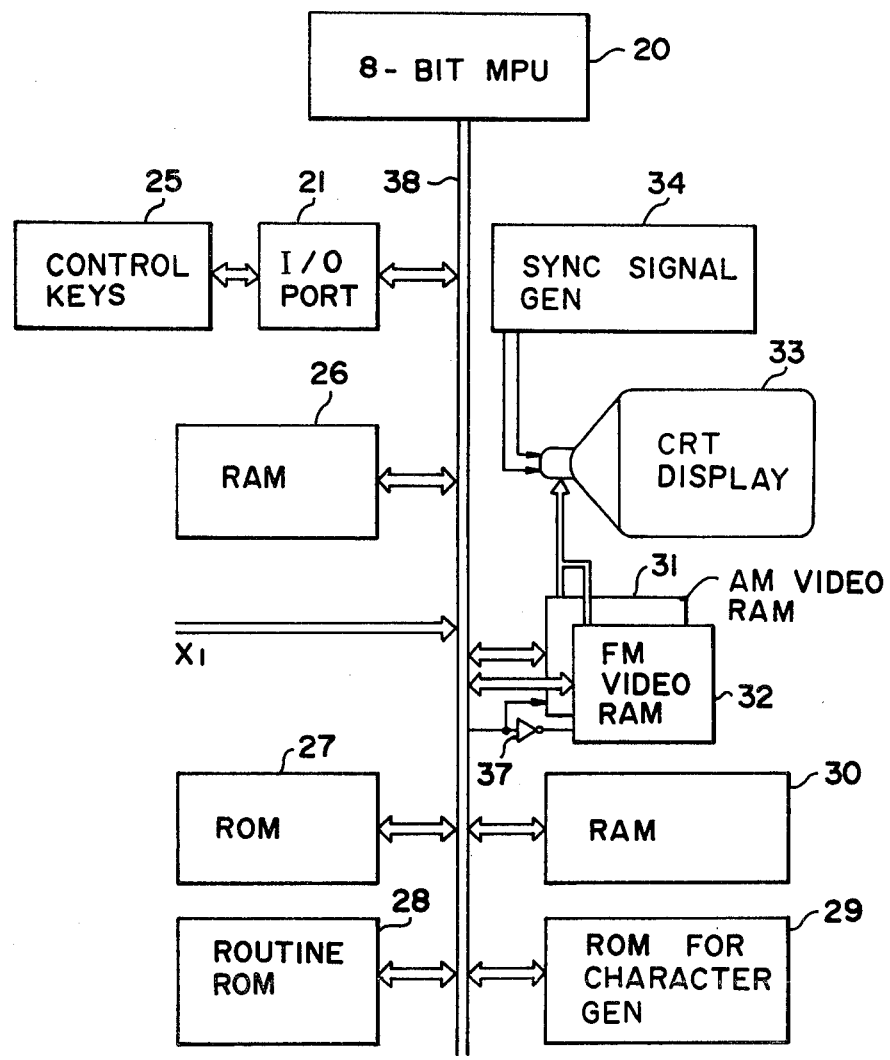

FIGS. 1(A) and 1(B) illustrate in block diagram form the principal part of a radio receiver embodying the present invention which is equipped with a spectrum analyzer display function. Reference numeral 10 indicates an antenna; 11 designates a high-frequency amplifier; 12 identifies a mixer; 13 denotes an intermediate-frequency amplifier; 14 represents a detector; 15 shows a power amplifier; 16 refers to a speaker; 17 signifies a local oscillator; 18 indicates an IC serving as a phase lock loop (PLL); 19 designates a four-bit microcomputer (hereinafter referred to as the 4-bit MPU) for controlling a radio tuner (i. e. for controlling a PLL synthesizer); 20 identifies an eight-bit microprocessor; 21 to 24 denote input/output interface circuits, for example, peripheral interface adaptors (hereinafter referred to as the I/O ports); 25 represents control keys; 26 shows an RAM for data buffering or storage or the like; 27 shows an ROM for a broadcasting station name map; 28 refers to a routine ROM having loaded therein a program for the operation of the eight-bit microprocessor 20, programs for the operation of the I/O ports 21 to 24 and other required programs; 29 signifies an ROM for character generation use; 30 indicates an RAM for making a spectrum analyzer list; 31 designates an AM video RAM; 32 identifies an FM video RAM; 33 denotes a CRT display; 34 represents a synchronizing signal generator; 35 shows a two-channel A/D converter; 36 refers to an AND circuit; 37 signifies as inverter; and 38 indicates a data, address and control bus for the eight-bit microprocessor 20.

The antenna 10, the high-frequency amplifier 11, the mixer 12, the intermediate-frequency amplifier 13, the detector 14, the power amplifier 15, the speaker 16, the local oscillator 17, the PLL IC 18 and the four-bit MPU 19 are components of a conventional known electronic tuning type radio receiver, and they are usually arranged as shown in FIGS. 2(A) and 2(B) to constitute it. In FIGS. 2(A) and 2(B) the parts corresponding to those in FIGS. 1(A) and 1(B) are identified by the same reference numerals. Reference numeral 50 indicates a display; 51 designates an electric field intensity meter (S meter); and 52 identifies a control key group. This embodiment is applied to such a radio receiver; hence, a description will be given thereof.

In FIG. 2 the tuning frequency of the high-frequency amplifier 11 and the oscillation frequency $f_0$ of the local oscillator 17 are controlled by a control voltage $e_r$ available from the PLL IC 18, and electric waves of a desired broadcasting station are received, selected and subjected to intermediate-frequency amplification, thereafter being provided via the detector 14 and the power amplifier 15 to the speaker 16. The four-bit MPU 19 possesses a channel selecting function responsive to the operation of the control key group (numeral 52) and provides a required frequency dividing ratio data (N value) to the PLL IC 18 and, at the same time, delivers out frequency data and channel number data to the display 50 to provide thereon displays of a received frequency and a channel number. The four-bit MPU 19 is, for instance, TC9124P (C-MOS) by Tokyo Shibaura Denki K. K. of Japan or MB8851 (C-MOS) by Fujitsu Limited of Japan, and the PLL IC 18 is, for example, C-MOS LSI TC9123P for PLL by Tokyo Shibaura Denki K. K.

The four-bit MPU 19 operates in synchronism with timing signals $T_1$ to $T_4$ which are independently generated therein, and input terminals $in_1$ to $in_5$ and output terminals $out_1$ to $out_4$ are used for other purposes for each of the timing signals $T_1$ to $T_4$. That is to say, keys of the same row in the control key group 52 are connected to the same input terminal and their output timing is controlled by the timing signals $T_1$ to $T_4$ for column selection use; for instance, as shown in FIG. 3, when the timing signal $T_1$ is ON, information of only keys $k_1$ to $k_5$ is applied to the input terminals $in_1$ to $in_5$. Similarly, when each of the other timing signals $T_2$ to $T_4$ are ON, information of keys of the corresponding column alone is provided to the input terminals $in_1$ to $in_5$. The four-bit MPU 19 reads out, for each timing signal, the input information of the input terminals $in_1$ to $in_5$ to obtain the information of all the keys $k_1$ to $k_{20}$. When outputting the frequency data, the four-bit MPU 19 is preset so that, for instance, output information at the timing $T_1$ represents received frequency information for the least significant position, and that output information at the timings $T_2$ to $T_4$ represents received frequency data of more significant positions in a sequential order. For example, when indicating FM 82.5 MHz, outputs at the output terminals $out_1$ to $out_4$ and the timing signals $T_1$ to $T_4$ bear such relationships as shown in FIG. 4, for instance. Incidentally, the channel selection can be directly carried out only by depressing a desired one of the preset keys in the control key group 52 and, further, what is called an automatic frequency sweep function is provided, by which, while a sweep "up" or "down" key is held ON, the received frequency can be continuously changed by steps of 9 or 10 KHz in the case of AM and by steps of 100 or 200 KHz in the case of FM. Furthermore, the electric field intensity $S_{AM}$ corresponding to an AM received frequency and the electric field intensity $S_{FM}$ corresponding to an FM received frequency are taken out from the intermediate-frequency amplifier 13 and their values are indicated by the electric field intensity meter 51. The above arrangement and operation are wellknown in the art.

According to the illustrated embodiment of the present invention, in such a prior art electronic tuning type radio receiver as described above, the CRT display 33 for displaying the electric field intensity distribution in each band is provided instead of the electric field intensity meter 51 and a host microcomputer system for controlling the display of the electric field intensity distribution and so forth comprises an eight-bit microprocessor 20 or the like as shown in FIG. 1.

In FIG. 1 the four-bit MPU 19 and the eight-bit microprocessor 20 are directly interconnected via the I/O ports 22 to 24. That is to say, the outputs at the frequency data output terminals $out_1$ to $out_4$ and the timing signal output terminals $T_1$ to $T_4$ of the four-bit MPU 19 are input into a register 222 of the I/O port 22; outputs at channel number output terminals $out_5$ to $out_8$ of the four-bit MPU 19 are input into the I/O port 23; and the output of the I/O port 24 is connected to key information input terminals $in_1$ to $in_5$ of the four-bit MPU 19.

Furthermore, the AND circuit 36 is provided which receives the timing signals $T_1$ to $T_4$ and applies its output as an interrupt signal to a controller 224 of the I/O port 22. In addition, the two-channel A/D converter 35 is provided which converts the electric field intensity $S_{AM}$ corresponding to the AM received frequency and the electric field intensity $S_{FM}$ corresponding to the FM received frequency, available from the intermediate-frequency amplifier 13, into digital form and provides the digital output to a register 221 of the I/O port 22. The outputs from the registers 221 and 222 are applied to a data selector 223 and either one of them is selected by the controller 224 and provided to the bus 38. The channel switching of the A/D converter 35 is carried out by the controller 224.

Figure 5:
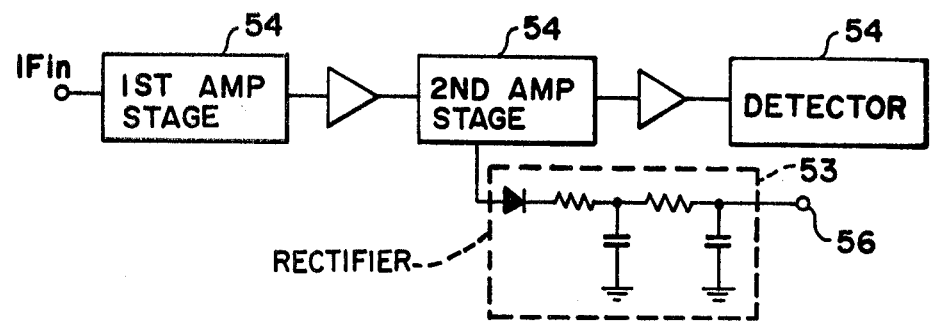

The electric field intensities $S_{AM}$ and $S_{FM}$ are detected in a DC form by the provision of a rectifier 53 in the IF stage in the case of AM as shown in FIG. 5 and, in the case of FM, they are detected in a DC form by rectifying the output of the IF stage but, in this case, since a limiter is provided, the DC output is obtained while being compensated as shown in FIG. 6. In FIGS. 5 and 6 reference numeral 54 indicates amplifier stages; 55 designates level detectors; 56 identifies an electric field intensity output terminal; and 57 denotes an orthogonal demodulator.

The four-bit MPU 19 is independently operable for controlling a PLL synthesizer and operates in synchronism with the timing signals $T_1$ to $T_4$ which are independently generated as described previously. Also the eight-bit MPU 20 is a host computer which executes control of the four-bit MPU 19 and, for example, a cassette deck control microcomputer (not shown) in synchronism with timing of its own. Accordingly, it is necessary to synchronize the four-bit MPU 19 and the eight-bit MPU 20 with each other; in the present invention, the synchronization of them is achieved by the program manipulation of the eight-bit MPU 20 in the following manner.

For instance, in the case where the timing signals of the four-bit MPU 19 are turned OFF even if for a very short period of time as indicated by $\Delta t_1$ and $\Delta t_2$ in FIG. 7, the output waveform of the AND circuit 36 becomes, for example, as shown in FIG. 7 and its fall coincides with the rise of a new timing signal. Then, by interrupting the eight-bit MPU 20 at the fall of the output signal of the AND circuit 36, it is possible to inform the eight-bit MPU 20 that the timing signals $T_1$ to $T_4$ have been changed. During interrupt handling of the eight-bit MPU 2, the timing signals $T_1$ to $T_4$ of the four-bit MPU 19 are input to detect the timing at which it is operating and, in the period in which the frequency data from the frequency data output terminals $out_1$ to $out_4$ of the four-bit MPU 19 are established, the data are read out via the I/O port 22 and key information corresponding to the timing is input from the I/O port 24 to the key information input terminals $in_1$ to $in_5$ of the four-bit MPU 19, by which the four-bit MPU 19 and the eight-bit MPU 20 can be synchronized with each other. In a similar manner, the channel number output from the channel number output terminals $out_5$ to $out_8$ of the four-bit MPU 19 is read out. Incidentally, if the conventional receiver is designed so that the period $\Delta t_1$ of the timing signal, shown in FIG. 7, becomes zero, the AND circuit 36 is replaced with a differentiation circuit which detects the fall of each of the timing signals $T_1$ to $T_4$.

In the above operation it is necessary that the eightbit MPU 20 input or transmit the key information corresponding to each timing of the four-bit MPU 19 to each of the MPU 19 key information input terminals $in_1$ to $in_5$. This means that, for instance, in the case where the four-bit MPU 19 calls for the following information for each of the input terminals $in_1$ to $in_5$ at each of the timing $T_1$ to $T_5$, when the timing $T_1$, for example, is detected as a result of the decision of the timing signal, it is necessary to output key information for the keys $k_1$ to $k_5$ from the eight-bit MPU 20.

TABLE 1

| Timing | Input terminal $in_1$ | Input terminal $in_2$ | Input terminal $in_3$ | Input terminal $in_4$ | Input terminal $in_5$ |
|---|---|---|---|---|---|
| $T_1$ | key $k_1$ | key $k_2$ | key $k_3$ | key $k_4$ | key $k_5$ |
| $T_2$ | key $k_6$ | key $k_7$ | key $k_8$ | key $k_9$ | key $k_{10}$ |
| $T_3$ | key $k_{11}$ | key $k_{12}$ | key $k_{13}$ | key $k_{14}$ | key $k_{15}$ |
| $T_4$ | key $k_{16}$ | key $k_{17}$ | key $k_{18}$ | key $k_{19}$ | key $k_{20}$ |

To perform this, the eight-bit MPU 20 reads out the state of the keys of the control key group 25 with a fixed period and selects only the information of the keys $k_1$ to $k_{20}$ necessary for the four-bit MPU 19 and stores their status information in the RAM 26 in an order, as shown in Table 1, corresponding to the timing $T_1$ to $T_4$. In other words, a table of matrix switch signals for the four-bit MPU 19 is prepared in the RAM 26 and, after the decision of the timing signal, the corresponding key information is read out from the table for output to the four-bit MPU 19. The readout of each key information of the control key group 25 is carried out, for instance, by sequentially selecting the columns of the control key group 25 with the timing signals $T_1$ to $T_4$ and reading out the key information of the selected columns via the I/O port 21.

Figure 8B:
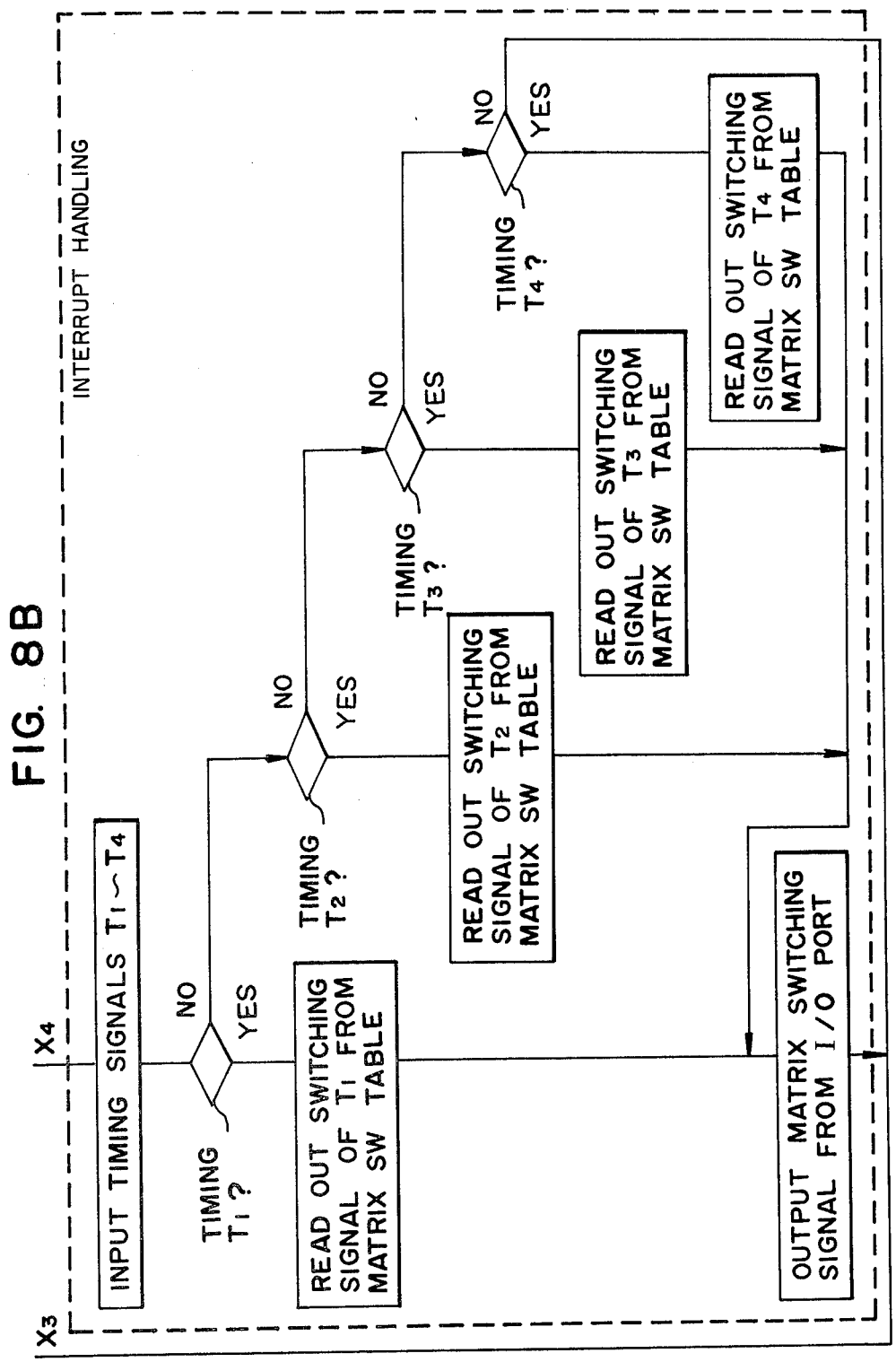

FIGS. 8(A) and 8(B) show a flowchart of the electric matrix switch signal output operation which is carried out by the eight-bit MPU 20. The steps surrounded by the broken line are performed by interrupt handling.

Figure 9:
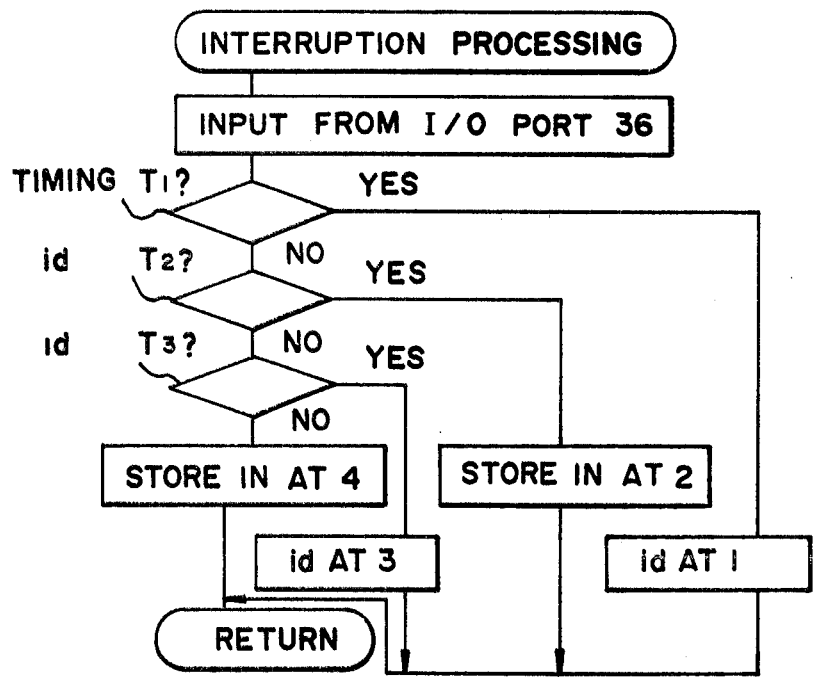
FIG. 9 is a flowchart of a frequency data input operation which is carried out by the eight-bit microprocessor 20.

FIG. 9 is a flowchart of the frequency data input operation which the eight-bit MPU 20 performs. The decision of concerning the timing signal takes place using the four higher-order bits of the eight input bits while masking the four lower-order bits. When loading the determined received frequency data into the RAM 26, only the four lower-order bits are used and 0s are inserted into the four higher-order bits; namely, a four-byte memory area is used as shown in FIG. 10.

In the manner described above, the frequency data and the channel number are read out by the eight-bit MPU 20 from the four-bit MPU 19 and the key information is input from the eight-bit MPU 20 into the four-bit MPU 19. The eight-bit MPU 20 reads out, by a similar operation, the digital electric field intensity information output from the A/D converter 35 and provides a spectrum analyzer display in such a manner as described below.

When a spectrum analyzer display key in the control key group 25 is turned ON, the eight-bit MPU 20 commands the four-bit MPU 19 by the above electric matrix switch signal output operation to perform an automatic sweep of the received frequency. This is carried out, for instance, by continuous application of manual channel selection "up" key information to the four-bit MPU 19. With the spectrum analyzer display key being turned ON, the four-bit MPU 19 gradually increases from a minimum value to a maximum value for the receiving band of the frequency dividing ratio data which is applied to the PLL IC 18. At this time, the eight-bit MPU 20 reads out the electric field intensity corresponding to the ever-changing received frequency and forms in the RAM 26 a spectrum analyzer list as shown below in Table 2.

TABLE 2

| Received frequency | S quantity |
|---|---|
| . | . |
| . | . |
| 80.6 | 80 |
| 80.7 | 125 |
| 80.7 | 70 |
| . | . |
| . | . |

Likewise, a list of the received frequency vs. S quantity (intensity) is also formed for the band other than that being received, for example, the AM band when FM broadcasting is being received.

Then the eight-bit MPU 20 sequentially reads out the list of the S quantities obtained as described above and produces a graph for displaying the received frequency vs. S quantity in each of the AM video RAM 31 and the FM video RAM 32. Incidentally, the reception condition after the frequency sweep is restored to the state immediately before the spectrum analyzer display key is turned ON.

Figure 11:
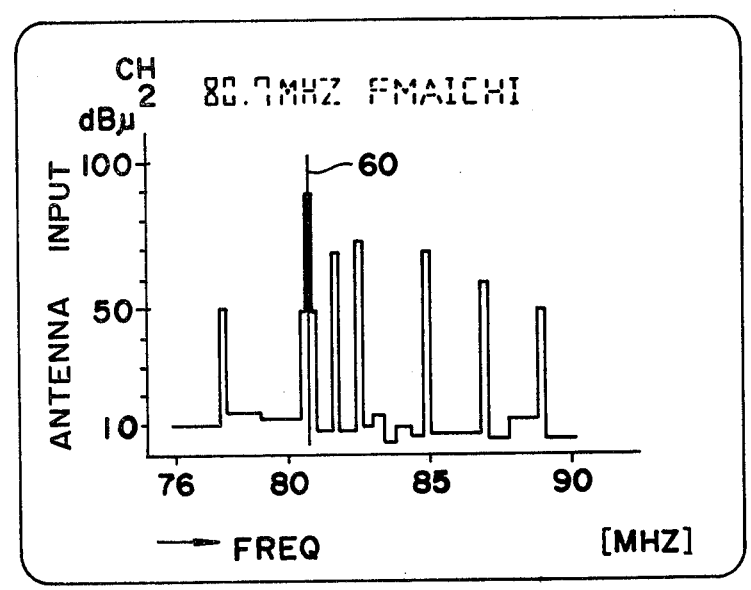
FIG. 11 is a diagram schematically showing an example of a spectrum analyzer display.

The CRT display 33 displays the contents of the video RAMs 31 and 32 in synchronism with horizontal and vertical synchronizing signals H and V from the synchronizing signal generator 34 and it displays such contents, for instance, as shown in FIG. 11. The coordinate axes and the unit necessary for the display are prestored as fixed patterns. The provision of such a display enables the user to rapidly select a broadcasting station of with the best reception.

In the case of FIG. 11, a cursor display is provided and the received frequency, indicated by a cursor 60, and the name of its broadcasting station are displayed, allowing more ease in the channel selection. This is carried out in such a manner as follows.

Upon turning ON of a preset list display key in the control key group 25, the eight-bit MPU 20 turns ON, by the afore-mentioned electric matrix switch signal output operation, preset keys in a sequential order, starting with the smallest number, to read out all preset information (received frequencies and their channel numbers) of the four-bit MPU 19 and draws up a preset list as shown in the following Table 3.

TABLE 3

| Channel | Frequency |
|---|---|
| 0 | 80.7 |
| 1 | 81.8 |
| 2 | 82.5 |
| . | . |
| . | . |
| 9 | |

The ROM 27 has prestored therein names of broadcasting stations corresponding to the receiving frequencies in the FM and AM frequency bands as shown in the following Table 4. The names of the broadcasting stations are represented, for example, by JIS codes (Japanese Industrial Standard which is equivalent to ASCII Standard). In the case of FM NHK, it is stored as 46, 4D, 4E, 48 and 4B.

TABLE 4

| FM Frequency Band | | | AM Frequency Band | | |
|---|---|---|---|---|---|
| Receiving Frequency MHz | Name of Broadcasting Station | Frequency Dividing Ratio | Receiving Frequency MHz | Name of Broadcasting Station | Frequency dividing Ratio |
| 80.0 | FM Tokyo | 800 | 558 | Radio Kansai | 558 |
| 80.3 | Utsunomiya | 803 | 594 | NHK Dai 1 | 594 |
| 80.7 | FM Aichi | 807 | 666 | NHK Dai 1 | 666 |
| 81.5 | Toyama | 815 | 693 | NHK Dai 2 | 693 |
| 81.6 | Maebashi | 816 | 729 | NHK Dai 1 | 726 |
| 81.8 | Tsu | 818 | 828 | NHK Dai 2 | 828 |
| 81.9 | Yokohama | 819 | 909 | NHK Dai 2 | 909 |
| 82.2 | Kanazawa | 822 | 954 | Tokyo Hoso | 954 |
| 82.5 | Nagoya | 825 | 1008 | Asahi Hoso | 1008 |
| 82.8 | Kyoto | 828 | 1053 | Chubu Nippon | 1054 |
| 83.2 | Mito | 832 | 1134 | Bunka Hoso | 1134 |
| 83.4 | Fukui | 834 | 1143 | Kinki Hoso | 1143 |
| 83.6 | Gifu | 836 | 1179 | Mainichi Hoso | 1179 |
| 84.0 | Ohtsu | 840 | 1242 | Nippon Hoso | 1242 |
| 84.2 | Himeji | 842 | 1314 | Osaka Hoso | 1314 |
| 85.1 | FM Osaka | 851 | 1332 | Tokai Hoso | 1332 |
| 85.6 | Kofu | 856 | 1422 | Radio Kanto | 1422 |
| 88.1 | Osaka | 881 | Others | (space) | unfixed |
| 88.8 | Shizuoka | 888 | | | |
| Others | (space) | unfixed | | | |

The eight-bit MPU 20 stores the received frequency in an index register and compares its content with each of the frequency data stored in the ROM 27 as shown in the flowchart of FIG. 12. When there is coincidence, the corresponding broadcasting station name code is read out and transferred to a broadcasting station name storage area of the RAM 26, from which the leading address of the character generator ROM 29 is indexed to obtain a character for display, which is transferred to the video RAMs 31 and 32. As a result, the frequency and the name of the broadcasting station are displayed as shown in FIG. 11. Further, the preset list of Table 3 is referred to and, if the corresponding receiving frequency is preset, its channel number is also displayed.

While in the foregoing embodiment the S quantity (intensity) for each constant frequency is displayed in a graphic form, it is also possible to provide a graphical display of only the S quantity of the preset broadcasting station on the CRT display, taking the preset contents into consideration. Also in this case, it is possible to display the name of the broadcasting station and its preset number in accordance with the position of the cursor in the same manner as described previously. The RAM 30 for storing the spectrum analyzer list in FIG. 1 is an RAM for storing the S quantities corresponding to the names of the broadcasting stations.

As will be appreciated from the foregoing description, according to the present invention, since the electric field intensity distribution is displayed on a CRT display or the like, the user can rapidly select a channel of high articulation or signal level. Accordingly, the present invention is of great utility when employed in a car radio and the like.

It will be apparent that many modifications and variations may be effected without departing from the scope of the novel concepts of the present invention.

What is claimed is:

1. An electronic tuning type radio receiver equipped with a spectrum analyzer display function, comprising:
    tuner means responsive to a received radio frequency signal and radio frequency designating information to provide a tuner means output signal indicative of the electric field intensity of said received radio frequency signal;
    frequency sweep means for sequentially changing said radio frequency signal designating information for selectively receiving different radio frequency signals;
    electric field intensity detecting means, operatively connected to said tuner means, for detecting the electric field intensity of the tuner means output signal and producing an analog field intensity signal;
    an A/D converter, operatively connected to said electric field intensity detecting means, for converting the analog electric field intensity signal from the electric field intensity detecting means into a digital quantity;
    key input means for providing key information;
    received signal frequency vs. electric field intensity distribution producing means, operatively connected to said A/D converter, said frequency sweep means and said key input means, for operating said frequency sweep means to sequentially change the radio frequency signal designating information for selectively receiving different radio frequency signals when said key information from said key input means is provided and for producing a received signal frequency vs. electric field intensity distribution in response to both sequentially read out digital outputs from said A/D converter during the information changing operation of said frequency sweep means and radio frequency output data from said frequency sweep means;
    storage means, operatively connected to said received signal frequency vs. electric field intensity distribution producing means, for storing the received signal frequency vs. electric field intensity distribution; and
    distribution display means, operatively connected to said received signal frequency vs. electric field intensity distribution producing means and said storage means, for displaying the received signal frequency vs. electric field intensity distribution based on the stored content of the storage means.

2. A radio receiver according to claim 1,
    wherein said frequency sweep means comprises means, responsive to an automatic sweep command and operatively connected to said received signal frequency vs. electric field intensity distribution means, for sequentially changing the radio frequency signal designating information in a predetermined manner and said tuner means providing a corresponding output signal for each sequential change, and
    wherein said received signal frequency vs. electric field intensity distribution producing means is responsive to the application of predetermined key information from said key input means to apply the automatic sweep command to said frequency sweep means, producing the received signal frequency vs. electric field intensity distribution indicating the electric field intensity for each predetermined received signal frequency.

3. A radio receiver according to claim 2, further comprising:
    broadcasting station name storage means, operatively connected to said received signal frequency vs. electric field intensity distribution producing means, for prestoring names of broadcasting stations corresponding to received signal frequencies in AM and FM frequency bands;
    cursor display means, operatively connected to said received signal frequency vs. electric field intensity distribution producing means and said display means, for displaying a cursor in an overlapping relationship with the received signal frequency vs. electric field intensity distribution displayed on said display means, the cursor being movable by a key operation of said key input means; and
    broadcasting station name display means, operatively connected to said received signal frequency vs. electric field intensity distribution producing means and said display means, for comparing data related to the received signal frequency at the position of the cursor with data stored in the broadcasting station name storage means and, in the case of coincidence, displaying the received signal frequency and the name of the corresponding broadcasting station on said distribution display means.

4. A radio receiver according to claim 2,
    wherein the frequency sweep means comprises:
        means, operatively connected to said received signal frequency vs. electric field intensity distribution producing means, for storing given radio frequency signal designating information corresponding to a channel number and being responsive to application of the channel number for changing the radio frequency signal being received to that corresponding to the given radio frequency signal designating information and
    wherein said distribution producing means comprises:
        identifying and broadcasting station display means for identifying a radio frequency signal corresponding to the radio frequency signal designating information set corresponding to each channel number when predetermined key information is input from said key input means;
        broadcasting station name storing means for prestoring names of broadcasting stations corresponding to frequencies of signals to be received in AM and FM frequency bands;
        cursor display means for displaying a cursor in an overlapping relationship with the received signal frequency vs. electric field intensity distribution displayed on said display means, the cursor being movable by a key operation of said key input means; and said identifying and broadcasting station display means further comparing data related to a received radio frequency signal at the position of the cursor with data stored in the broadcasting station name storing means and, in the case of coincidence, displaying the received signal frequency, the corresponding channel number and the name of the corresponding broadcasting station on said distribution display means.

5. A radio receiver according to claim 1, wherein said frequency sweep means comprises:

means, operatively connected to said received signal frequency vs. electric field intensity distribution producing means, for storing given radio frequency signal designating information corresponding to a channel number; and means, responsive to application of the channel number and operatively connected to said means for storing, for changing the frequency of the signal being received to a frequency corresponding to the given radio frequency signal designating information; and wherein said received signal frequency vs. electric field intensity distribution producing means is responsive to the application of predetermined key information from the key input means to sequentially apply channel numbers to said frequency sweep means, producing the received signal frequency vs. electric field intensity distribution indicating only the electric field intensity for each channel number.

6. A radio receiver according to claim 1, further comprising:

identifying and broadcasting station display means, operatively connected to said received signal frequency vs. electric field intensity distribution producing means, for identifying a radio frequency signal corresponding to the radio frequency signal designating information preset corresponding to each channel number when predetermined key information is input from said key input means;

broadcasting station name storage means, operatively connected to said received signal frequency vs. electric field intensity distribution producing means, for prestoring names of broadcasting stations corresponding to frequencies of signals to be received in AM and FM frequency bands;

cursor display means, operatively connected to said received signal frequency vs. electric field intensity distribution producing means and said display means, for displaying a cursor in an overlappling relationship with the received signal frequency vs. electric field intensity distribution displayed on said display means, the cursor being movable by a key operation of the key input means; and said identifying and broadcasting station display means further comparing data related to a received radio frequency signal at the position of the cursor with data stored in said broadcasting station name storage means and, in the case of coincidence, displaying the received signal frequency, the corresponding channel number and the name of the corresponding broadcasting station on said distribution display means.

7. An electric field distribution display radio receiver, comprising:

an electronic radio frequency tuner for receiving radio frequency signals;

processing means, coupled to said tuner, for selecting particular ones of said received radio frequency signals in dependence on frequency control data applied thereto and for producing an output signal containing frequency data;

intermediate frequency amplifier and detector means, coupled to said tuner, for producing and intensity signal related to the signal intensity of a selected frequency signal;

rectifying means, operatively connected to said intermediate frequency amplifier and detector means, for producing a DC intensity signal in response to said intensity signal;

converter means, operatively connected to said rectifying means, for converting the DC intensity signal into a digital intensity signal;

interface means, operatively connected to said converter means and said processing means, for storing and passing therethrough the digital intensity signal, the frequency control data and the output signal containing frequency data;

input means for providing control signals;

distribution display control means, operatively connected to said input means and said interface means, for providing said frequency control data via said interface means to said processing means to select the received radio frequency signals in further dependence upon the control signals and, in response to said digital intensity signal and said output signal, generating intensity vs. frequency distribution display data for a plurality of said selected received radio frequency signals; and display means, operatively connected to said distribution display control means, for displaying the intensity vs. frequency distribution display data in the form of a frequency spectrum graphic display.

* * * * *

UNITED STATES PATENT AND TRADEMARK OFFICE
CERTIFICATE OF CORRECTION

PATENT NO. : 4,476,579
DATED : OCTOBER 9, 1984
INVENTOR(S) : TATSUO ITO ET AL.

It is certified that error appears in the above-identified patent and that said Letters Patent is hereby corrected as shown below:

```
Col. 1, line 29, delete "with";
        line 30, "of" should be --with--.

Col. 3, line 47, delete "known".

Col. 4, line 49, "wellknown" should be --well-known--.

Col. 5, line 67, "eightbit" should be --eight-bit--.

Col. 6, line 42, delete "of".

Col. 7, line 3, "receivcd" should be --received--;
        line 60, delete "of";
        line 68, "afore-mentioned" should be
                 --aforementioned--.
```

Signed and Sealed this

Second Day of July 1985

[SEAL]

Attest:

DONALD J. QUIGG

*Attesting Officer*   *Acting Commissioner of Patents and Trademarks*